United States Patent
Nair et al.

(10) Patent No.: US 7,666,328 B2
(45) Date of Patent: Feb. 23, 2010

(54) THICK FILM CONDUCTOR COMPOSITION(S) AND PROCESSING TECHNOLOGY THEREOF FOR USE IN MULTILAYER ELECTRONIC CIRCUITS AND DEVICES

(75) Inventors: Kumaran Manikantan Nair, Head of the Harbor, NY (US); Mark Frederick McCombs, Clayton, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 631 days.

(21) Appl. No.: 11/601,136

(22) Filed: Nov. 16, 2006

(65) Prior Publication Data

US 2007/0113952 A1 May 24, 2007

Related U.S. Application Data

(60) Provisional application No. 60/738,864, filed on Nov. 22, 2005.

(51) Int. Cl.
*H01B 1/22* (2006.01)
*B05D 5/12* (2006.01)

(52) U.S. Cl. .................. 252/514; 427/97.2

(58) Field of Classification Search ............ 252/514; 106/1.21; 427/96, 97
See application file for complete search history.

(56) References Cited

U.S. PATENT DOCUMENTS

| | | | |
|---|---|---|---|
| 2,760,863 A | 8/1956 | Plambeck, Jr. |
| 2,850,445 A | 9/1958 | Oster |
| 2,875,047 A | 2/1959 | Oster |
| 2,927,022 A | 3/1960 | Martin at al. |
| 3,074,974 A | 1/1963 | Gebura |
| 3,097,096 A | 7/1963 | Oster |
| 3,097,097 A | 7/1963 | Oster et al. |
| 3,145,104 A | 8/1964 | Oster et al. |
| 3,380,831 A | 4/1968 | Cohen et al. |
| 3,427,161 A | 2/1969 | Laridon et al. |
| 3,479,185 A | 11/1969 | Chambers, Jr. |
| 3,549,367 A | 12/1970 | Chang et al. |
| 4,162,162 A | 7/1979 | Dueber |
| 4,381,945 A | 5/1983 | Nair |
| 5,049,480 A | 9/1991 | Nebe et al. |
| 5,210,057 A | 5/1993 | Haun et al. |
| 5,922,627 A * | 7/1999 | Nabatian et al. ............ 501/17 |
| 6,147,019 A | 11/2000 | Donohue |
| 6,814,795 B2 * | 11/2004 | McVicker et al. ...... 106/170.58 |
| 7,560,050 B2 * | 7/2009 | Satou et al. ................ 252/512 |

FOREIGN PATENT DOCUMENTS

GB 772675 4/1957

OTHER PUBLICATIONS

Aqualon (R) Product Data Sheet (No. 4364), Hercules Inc. Aqualon.com, no pub date.*
U.S. Appl. No. 60/703,530, filed Jul. 28, 2005, Nair et al.

(Continued)

*Primary Examiner*—Mark Kopec

(57) ABSTRACT

The invention relates to thick film conductor compositions which are useful in application to both via-fill and/or line conductors to manufacture of Low Temperature Co-fireable Ceramic (LTCC) devices and other Multilayer Interconnect (MLI) ceramic composite circuits such as Photosensitive Tape On Substrates (PTOS); gold, silver and mixed metal multilayer circuits and devices. The invention is useful for forming microwave and other high frequency circuit components selected from the group comprising: antenna, filters, baluns, beam former, I/O's, couplers, via feedthroughs, EM coupled feedthroughs, wirebond connection, and transmission lines.

14 Claims, 4 Drawing Sheets

OTHER PUBLICATIONS

U.S. Appl. No. 60/674,433, filed Apr. 25, 2005, Nair et al.
U.S. Appl. No. 11/543,742, filed Oct. 5, 2006, Hang et al.
U.S. Appl. No. 11/490,011, filed Jul. 20, 2006, Nair et al.
U.S. Appl. No. 10/910,126, filed Aug. 3, 2004, Bidwell et al.

* cited by examiner

THICK FILM CONDUCTOR COMPOSITION(S) AND PROCESSING TECHNOLOGY THEREOF FOR USE IN MULTILAYER ELECTRONIC CIRCUITS AND DEVICES

FIELD OF THE INVENTION

The invention relates to thick film conductor compositions which are useful in application to both via-fill and/or line conductors to manufacture of Low Temperature Co-fireable Ceramic (LTCC) devices and other Multilayer Interconnect (MLI) ceramic composite circuits such as Photosensitive Tape On Substrates (PTOS); gold, silver and mixed metal multilayer circuits and devices, as well as the cost-effective manufacturing of LTCC, PTOS, MLI circuits and devices. Compositions are single printable to reduce the cost of printing and processing of both line conductors and via-fill conductors together or singly. The invention also relates to printing and processing technology of high solid-containing and low viscosity via-fill thick film compositions to make multilayer devices comprising a large number of layers and thicker tapes.

TECHNICAL BACKGROUND OF THE INVENTION

Thick film conductors serve as electrical interconnections between resistors, capacitors, inductors, integrated circuits etc. Besides, in multilayer devices and circuits, these conductors interconnect between layers of conductor lines through vias built into the devices. In other words, tape-casted ceramic green sheets for LTCC devices are punched, screened with appropriate conductor lines, stacked and laminated prior to firing. Punching involves mechanical perforation of vias through each layer which are filled with via-fill conductor formulations to interconnect the circuitry between layers. Processing of PTOS circuits are described in a recent invention disclosure U.S. Provisional Patent Application No. 60/703,530, herein incorporated by reference. In other words, interconnect devices are an electronic circuits and surface and buried sub systems of resistors, capacitors, inductors etc that are connected both by electrically and mechanically, "green systems", electronic systems contain very little or no known toxic materials, is a new goal for environmentally safer to the public-at-large and furthermore the public desired such systems.

Similar to other thick film materials, thick film conductors and via-fills are comprised of an active (conductive) metal and inorganic binders, both of which are in finely divided form and are dispersed in an organic vehicle. The conductive phase is ordinarily gold, palladium, silver, platinum or alloy thereof, the choice of which depends upon the particular performance characteristics which are sought, e.g. resistivity, solderability, solder leach resistance, bondability, adhesion, migration resistance and the like. In multilayer devices, internal conductor lines and via conductors additional performance characteristics which are sought, e.g. minimization of conductor line "sinking" into the top and bottom dielectric layers on firing, resistivity variation on repeated firing, interface connectivity of line conductor to that of via-fill conductor, interface bonding of via-fill conductor to that of surrounding ceramic materials.

Thick film techniques are contrasted with thin film techniques which involve deposition of particles by evaporation or sputtering with or without vacuum. Thick film techniques are well known to those skilled in the art.

In addition to the proper level of conductivity and other properties listed above, there are many secondary properties which must also be present such as, wire bondability, good adhesion to both ceramic and thick films, solderability and compactibility to other thick films, both surface and buried, long-term stability without little or less properties degradation.

As would be expected, one critical variable in the technology of thick film conductors for use in the multilayer interconnect devices is the resistivity variation by interaction with surrounding ceramics. Of particular importance in this regard has been the incorporation of high-melting refractory glasses and glasses have little or no miscibility with the remnant glasses present in the surrounding ceramics. Furthermore, additional incorporation of metal oxide and non-metal oxide binder materials in the composition increases the densification of the conductor composites and/or control the growth of crystalline materials into the conductor composites which would change the resistivity of the composites, a non-desirable result.

Additionally, the second most critical variable in the technology used in the MLI devices is the interface connection of via-fill buried within and the line conductor. Due to the differences in the solids and printing conditions which are needed to fill the vias completely and to connect vias to the line conductors result in conductor-via interface stress development and significant delaminations and microstructure variations at the interface which result in conductivity differences, an unwanted result.

As would be expected, the third most critical variable in the state-of-the-art thick film technology used in the MLI devices is the printing differences needed to fill vias and line conductors, due to the significant viscosity differences of the formulations. Typical via-fill conductor formulation viscosity is in the range of 1500-7000 or more PaS and that of line conductors is typically in the range of 150-300 PaS. These viscosity differences are critical to fill vias and fast printing of line conductor formulations. Lower viscosity via-fill formulations could "flow out of the bottom of the tape" and show "peaking"; and high viscosity formulations need more than one print to fill the vias. Many high viscosity formulations also show "posting" of the vias. On the other hand, line conductor formulation viscosity should be kept low in order to print connective lines without line-break, thinner lines and print the formulation fast enough for better productivity.

The fourth most critical variable is the processing of multilayer interconnect laminate without delamination particularly thicker laminates containing higher number of layers and thicker Green tapes up to 10 mils or higher. These green parts contain large amount of organics. During the heat processing, resins and polymers present will "depolymerize" to monomers, dimers etc. which have higher vapor pressure than the parent polymer, leaves the system at the early stages of the processing. The residual organic components decompose to carbon containing species later in the process.

The temperature profile needed to get rid of all the organics before softening of the glasses present in the tape depends on: quantity and quality of the organics, rate of heating, temperature, firing atmospheric conditions etc. Variations of one or more of the above components result in delaminated of layers, via-to-tape side wall separation, via-to-line conductor separation and finally yield loss.

BRIEF DESCRIPTION OF THE FIGURES

FIG. 1a represents the structural formula of ethylcellulose. FIG. 1b represents the structural formula of ethylcellulose with complete (54.88%) ethoxyl substitution.

Dashed line represents internal buried via connections and solid lines represent surface via connections.

Figure 3:
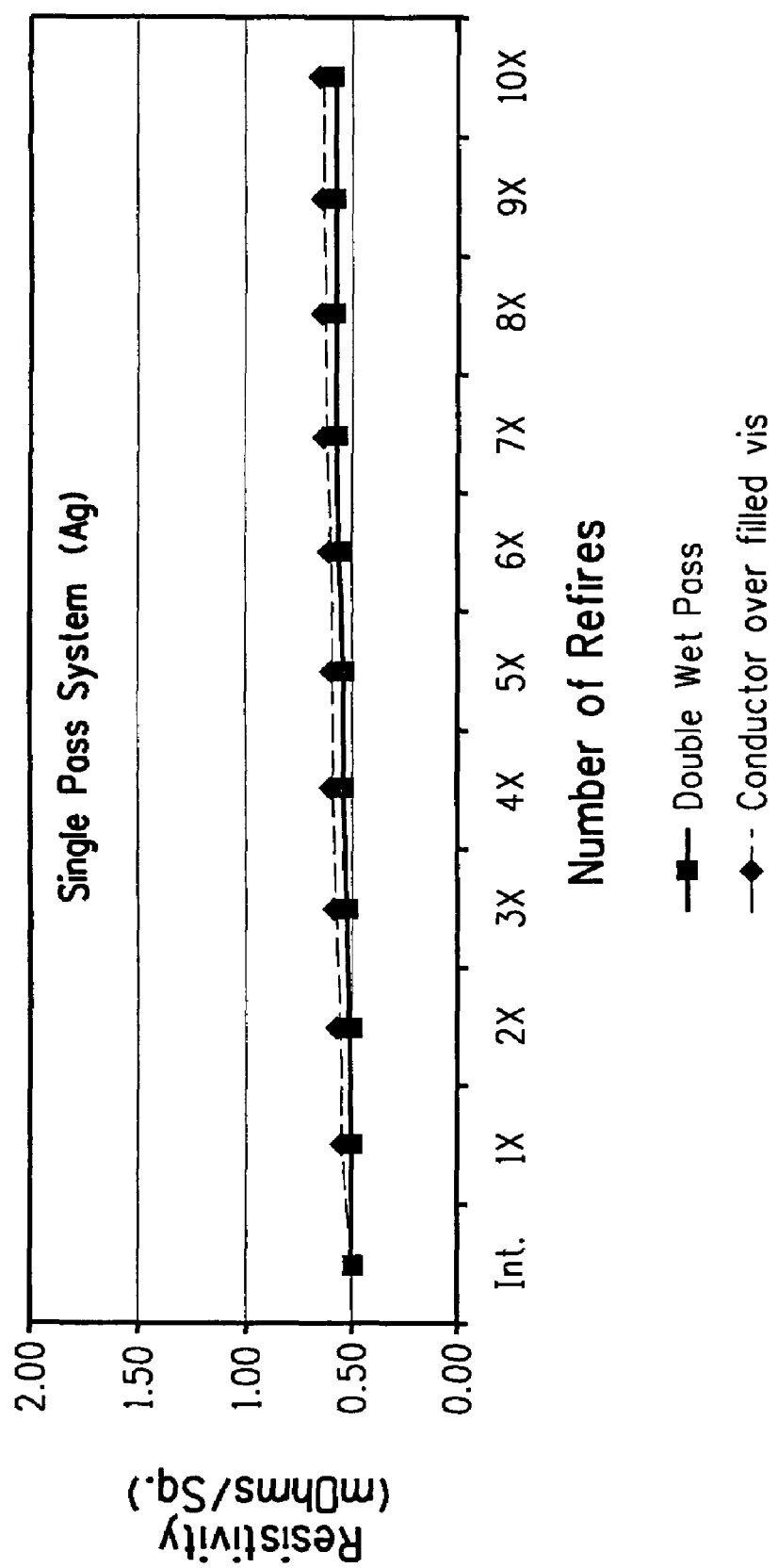
Figure 4:
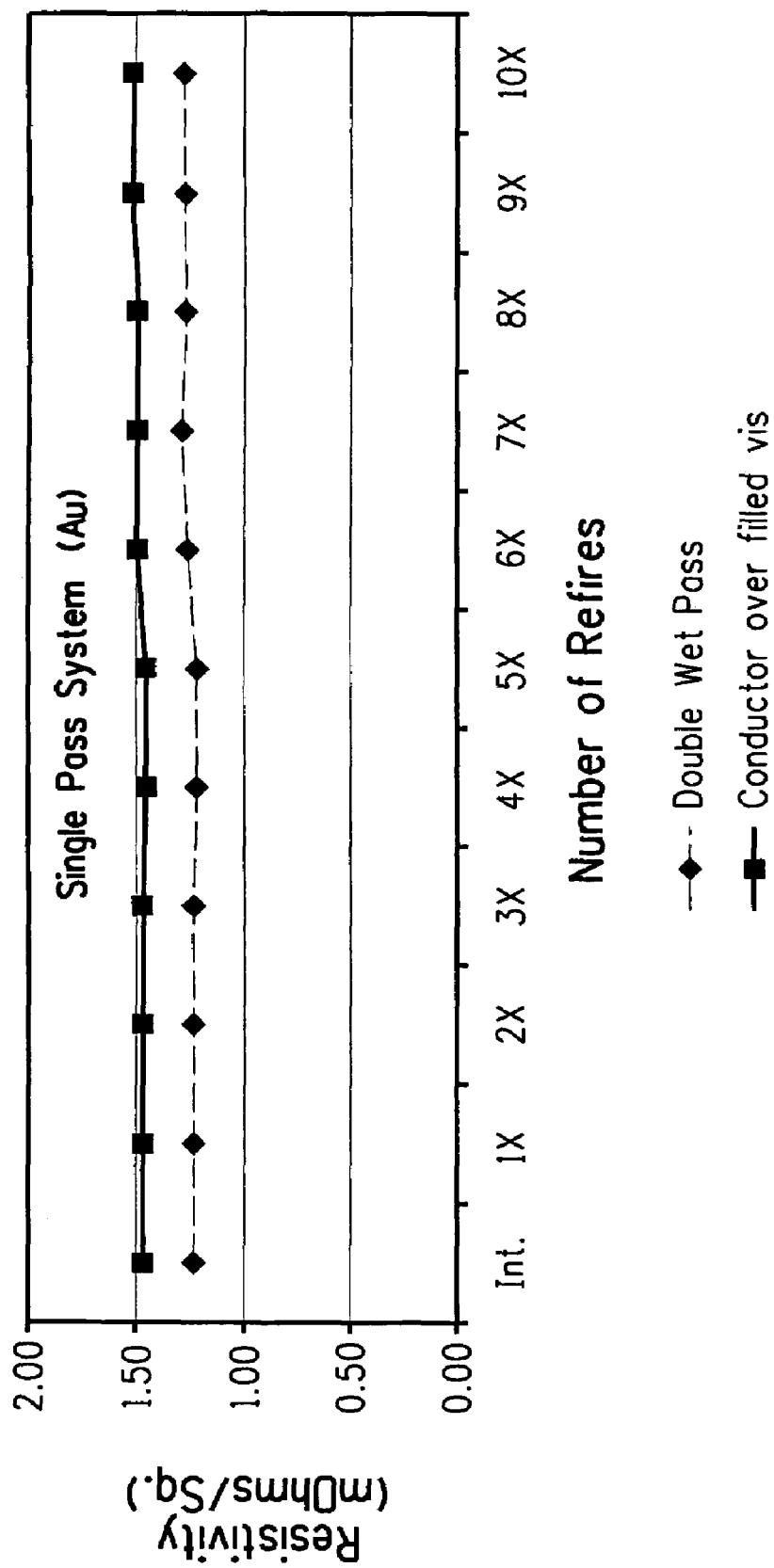

FIGS. 3 & 4: Resistivity variation as a function of number of refires. Two types of processing conditions were used. (1) "Double wet pass" filling both the vias and line conductors together (2) Fill the vias first and print the line conductor over it using the same composition. FIG. 3 refers to silver conductor on low loss tape 943-PX (E. I. du Pont de Nemours and Company) and FIG. 4 refers to gold conductors on 951-AT tape (E.I. du Pont de Nemours and Company).

SUMMARY OF THE INVENTION

The present invention relates to a thick film composition for use in low temperature co-fired ceramic circuits comprising, based on weight percent total thick film composition:
- (a) 30-96 weight percent finely divided particles selected from noble metals, alloys of noble metals and mixtures thereof;
- (b) one or more inorganic binders selected from:
  - (1) 0.2-10 weight percent of one or more refractory glass compositions with a specific viscosity (log n) in the range of 6-7.6 at the firing temperature of said circuit;
  - (2) 0.1-5 weight percent of an additional inorganic binder selected from (i) metal oxides, (ii) precursors of metal oxides; (iii) non-oxide borides; (iv) non-oxide silicides; and (v) mixtures thereof; and
  - (3) mixtures thereof; dispersed in
- (c) 2-20 weight percent organic medium comprising ethyl cellulose with a specific ethoxyl content in the range of 45.0-51.5 and degree of substitution of ethoxyl groups per anhydroglucose unit in the range of 2.22-2.73.

In a low temperature co-fired ceramic circuit, the above composition may be processed to sinter the glass, the metal powders and/or other sintering aids and to remove organic medium. In one embodiment the refractory glass composition comprises, based on weight percent total glass composition, 25-60% SiO2, 10-20% Al2O3, 10-15% B2O3, 5-25% CaO, and 1-5% balance other network modifying ions.

The invention further comprises a method of forming a multilayer circuit comprising:
- a) forming a patterned array of vias in a plurality of layers of green tape;
- b) filling the vias in the green tape layer(s) of step (a) with a via-fill thick film composition;
- c) printing patterned thick film functional layers over a surface of any or all of the via-filled green tape layers of step (b);
- d) printing patterned layers of a surface thick film over the outermost surface of the Green tape layers of step (c);
- e) laminating the printed green tape layers of step (d) to form an assemblage comprising a plurality of unfired interconnected functional layers separated by unfired green tape; and
- f) cofiring the assemblage of step (e); and wherein one or more of said via-fill thick film composition, patterned thick film functional layers and surface thick film utilize the above composition.

The invention further comprises:
- a) forming a patterned array of vias in a plurality of layers of green tape;
- b) filling the vias in the green tape layer(s) of step (a) with a via-fill thick film composition;
- c) printing patterned thick film functional layers over a surface of some or all of the via-filled Green tape layers of step (b);
- d) laminating the printed green tape layers of step (c) to form an assemblage comprising a plurality of unfired interconnected functional layers separated by unfired green tape;
- e) printing at least one patterned layer of surface thick film composition over the assemblage of step (d); and
- f) cofiring the assemblage and patterned layer(s) of step (e); and
- wherein one or more of said via-fill thick film composition, patterned thick film functional layers and surface thick film utilize the above composition.

In several embodiments, the present invention relates to the methods above wherein said via-fill thick film composition and at least one of said thick film functional layer(s) utilize the composition of the present invention and wherein said via-fill thick film composition and thick film functional layer(s) are printed simultaneously in one single step. The invention also relates to the circuits formed by the above methods.

DETAILED DESCRIPTION OF THE INVENTION

The invention is therefore directed to a the processing of noble metallization with unique organic components to maintain low enough viscosity to single-print both conductor lines and via-fill conductors without posting or flowing out. The invention is further directed specifically to the processing of LTCC devices where printing over the tape backing such as mylar; in the case PTOS devices, fill the vias including the "undercutting" of the tape after exposure for the manufacture of printed conductors. Fired circuits have outstanding electrical properties on repeated firing of the devices. In particular, the invention is directed to a series of metal metallizations suitable for the manufacture of pure silver, gold and mixed metal electronic devices, which is admixture of:
- (a) 30-96 weight percent finely divided particles selected from noble metals, alloys of noble metals and mixtures thereof;
- (b) one or more inorganic binders selected from:
  - (4) 0.2-10 weight percent of one or more refractory glass compositions with a specific viscosity (log n) in the range of 6-7.6 at the firing temperature of said circuit;
  - (5) 0.1-5 weight percent of an additional inorganic binder selected from (i) metal oxides, (ii) precursors of metal oxides; (iii) non-oxide borides; (iv) non-oxide silicides; and (v) mixtures thereof; and
  - (6) mixtures thereof; dispersed in
- (c) 2-20 weight percent organic medium comprising ethyl cellulose with a specific ethoxyl content in the range of 45.0-51.5 and degree of substitution of ethoxyl groups per anhydroglucose unit in the range of 2.22-2.73.

The above indicated functionality of the components being obtainable by firing the mixture to effect sintering of the inorganic materials, glasses and metal or collectively the firing of the composite systems.

A further aspect the invention is directed to screen-printable and/or stencil-applicable paste comprising the above-described metallization dispersed in organic medium specifically directed to certain type of ethyl cellulose containing enough ethoxyl groups to give "hydrophobic" character which is a needed property to make high solid, low viscosity and fast printing formulations. Still further, the invention is directed to conductive elements comprising a nonconductive LTCC ceramic substrate, PTOS, or other MLI substrates having a conductive pattern and connecting or non connecting via-fill conductive pattern affixed thereon formed by printing a pattern of above-described screen-printable and/or stencil-applying paste and firing the printed and/or laminated to effect voltization of the organic medium and liquid phase sintering of the inorganic materials and metallization. In yet another aspect, the invention is directed to a process for making conductors alone and/or in conjunction with via-fills comprising (a) applying patterned thick film of the above-described screen-printable paste to a non conductive ceramic substrate, (b) drying the film at a temperature below 200° C. and (c) firing the dried film to effect liquid phase sintering of the inorganic materials and metallization.

In a further aspect of the invention is directed to the printing and processing technology and of LTCC and MLI devices comprising large number of thick layers, of 10 mils or higher, of non-conductive ceramics having conductive patterns connected with or without conductive via-fills, laminated; heat-processed using long heating profile to get rid of organics and result in improved devices.

A. Conductive Material

The finely divided metals used in the invention can be of those noble metal powders which are commercially available for the thick film conductors or organic-coated noble metal powders for better dispersion. The conductive material may be coated or not coated with organic materials. In particular, the finely divided metal particles may be coated with a surfactant. In one embodiment, the surfactant is selected from stearic acid, palmitic acid, a salt of stearate, a salt of palmitate and mixtures thereof. The counter-ion can be, but is not limited to, hydrogen, ammonium, sodium, potassium and mixtures thereof.

The particle size of the above-described metallic materials is not narrowly critical from the standpoint of their technical effectiveness in the invention. However, they should, of course, be of a size appropriate to the manner in which they are applied, which is usually screen-printing and/or stencil-applying, and to the firing conditions. Furthermore, particle size and morphology of the above-mentioned metal powders should be appropriate in screen-printing and/or stencil-applying over non-fired ceramic tape of thickness between 2 mil to 10 mil or higher and to the laminating conditions of the composite and to the firing conditions. Thus the metallic material should be no bigger than 10 um and preferably should be below about 5 um. As a practical matter, the available particle size of the metals is as low as 0.1-10 um for palladium, from 0.1 to 10 um for silver, 0.2-10 um for platinum and from 0.5-10 um for gold.

When Pd/Ag is used as the conductive material, the ratio of Pd/Ag metal powders can vary between 0.06 and 1.5 preferably between 0.06 and 0.5. When Pd/Ag is used as the conductive material, the ratio of Pd/Ag metal powders can vary between 0.003 to 0.2 and preferably 0.003 to 0.05. Similar ratios can be used in the case of Pt/Pd/Au. The metal powders can have either flake or nonflake morphology. The nonflake powders can be irregularly shaped or spherical. By flake morphology is meant a metal powder whose predominant shape is flake as determined by scanning electron microscopy. Such flake silvers have an average surface area of approximately 1 m2/g and sold contents of approximately 99-100% by weight. Nonflake silver powders typically have an average surface area 0.1-2.0 m2/g and solid contents of approximately 99-100% by weight.

Palladium metal powder has an average surface area of 2.0-15.0 m2/g, preferably, 7.0-11.0 m2/g and solid contents of approximately 99-100% by weight. Platinum metal powder has a surface area of approximately 10 m2/g to 30 m2/g and a solids content of 98-100% by weight. Gold metal powder has a surface area of approximately m2/g and a solids content of 99-100% by weight.

Examples of gold powders used in embodiments of the present invention include gold metal powders which typically have a particle size distribution (PSD) d50 ~0.5 to 5 um, measured using Scanning Electron Microscope (SEM) and a solids content of 99-100% by weight. In some embodiments the gold metal powders are mono-sized, comprise few twins, and have a tight PSD. Coarser powders of d50 ~5 um with wider distribution also used.

In one embodiment of the present invention spherical metallic powders are utilized. These spherical metallic powders, when packed have a greater particle-to-particle contact versus flake and other shaped powders, which gives rise to a metal-to-metal contact and thus a relatively continuous flow of electrons for conduction when combined with the other components of the present invention. These closely packed metal spherical particles allow for "tetrahedral" and/or "octrahedral" voids, wherein the specific inorganic binders of the present invention, such as metal oxides and/or glasses described below, may settle and upon processing the inorganic binders soften and hold the structure together in a uniform honeycomb-type structure with superior metal-to-metal contact and more continuous electron flow as compared to prior art compositions. In one embodiment, spherical metallic particles with an average particle size distribution in the range of 1 to 4 microns are preferred. In another embodiment, an average particle size of 2 to 3 microns is preferred. These spherical powders when in combination with the inorganic binders described below are particularly useful in microwave applications.

B. Inorganic Glass Binder

The inorganic binders of the present invention are one or more inorganic binders selected from (1) 1-20 weight percent of one or more refractory glass compositions with a specific viscosity (log n) in the range of 6-7.6 at the firing temperature of said circuit, (2) 0.1-5 weight percent of an additional inorganic binder selected from (i) metal oxides, (ii) precursors of metal oxides; (iii) non-oxide borides; (iv) non-oxide suicides; and (v) mixtures thereof, and (3) mixtures thereof.

The glass component of the conductor compositions of this invention is a, high-softening point, high viscosity glass at 1-20 parts by weight based on total thick film composition and, preferably, at 1-15 parts level. As used herein, the term high-softening point glass is one having a softening point 600-950° C., preferably, 750-870° C. as measured by the parallel plate viscosity measuring techniques (ASTM method).

The glass utilized in this invention must also be immiscible or have only partial miscibility with the remnant glasses present in the LTCC substrate glasses at the firing conditions. Upon firing of an LTCC structure glasses present in the LTCC dielectric Green tape will partially crystallize and result in the formation of very low melting "remnant glasses" along with the high melting inorganic crystalline materials. The chemistry of the "remnant" glass will be different than that of the "parent" glass; as a result, the softening point and other properties of "remnant" glass will also be different from its "parent" glass. As a general rule, the viscosity of the "remnant" glass at the LTCC firing temperature will be lower than the "parent" glass.

A glass having a specific viscosity (log n) of ~6 to ~7.6 at the firing temperature which is capable of reduced intermixing with glasses present in the LTCC substrate glasses, but at the same time capable of aiding the sintering processes of the metallization is preferred.

Typical examples of glasses meeting the above criteria are "alumino-boro-silicate glass network" containing "glass network modifying" ions such as Ca, Ba, Ti, Fe, Mg, Na, K etc by weight, 40-60% $SiO_2$, 10-20% $Al_2O_3$, 10-15% $B_2O_3$, 15-25% CaO, 1-5% other above-mentioned "network modifying" ions. A particular preferred glass contains 55% $SiO_2$, 14% $Al_2O_3$, 7.5% $B_2O_3$, 21.5% CaO, and the balance 2% the above-mentioned "networking modifying" ions. Another preferred glass contains 56.5% $SiO_2$ 9.1% $Al_2O_3$, 4.5% $B_2O_3$, 17.2% PbO, 8.0% CaO and the balance 5% the above-mentioned "network modifying" ions.

The glasses are prepared by conventional glass-making techniques, by mixing the desired components in the desired proportions and heating the mixture to form a melt. As is well-known in the art, heating is conducted to a peak temperature and for a time such that the melt become entirely liquid and homogenous. In the prest work the components are premixed by sking in a polyethylene jar with plastic balls and melted in a platinum crucible at 1350-1400° C. The melt is heated at the peak temperature for 1-1.5 hours. The melt is then poured into cold water. The maximum temperature of the water during quenching is kept as low as possible by increasing the volume of water to melt ratio. The crude frit, after separation from water, is freed from residual water by drying in air or displacement of water by rinsing with methanol. The crude frit is the ball-milled for 6-7 hours in alumina containers using alumina balls. Alumina picked up by the materials, if any, is not within the observable limits as measured by X-ray diffraction analysis.

After discharging the milled slurry from the mill, the excess solvent is removed by decantation and the frit powder is hot air-dried. The dried powder is then screened through a 325 mesh screen to remove any large particles.

The major two properties of the frits are: it aids the sintering of the inorganic crystalline particulate matters and minimize the intermixing of conductor materials with remnant glasses present in the LTCC ceramics.

C. Metal Oxide/Non-Oxide Binder

The metal oxides and non-oxides such as borides and silicides which are suitable for the practice of the invention are those which are capable of reacting with remnant glasses of the tape and increase the viscosity of the remnant glasses when the composition of the invention cofired with the tape, either on the surface or buried. Second characteristics of these binders are during the firing of the system they should act as "sintering inhibitors" for the metal powders minimizing the densification of the line conductors and via-fill conductors.

Suitable inorganic oxides are those based on Zn, Mg, Co, Al, Zr, Mn, Ni, Cu, Ta, W, La, $Zn^{2+}$, $Mg^{2+}$, $Co^{2+}$, $Al^{3+}$ and complex oxides such as copper bismuth ruthenate, and organometallic compounds such as organotitanate those disclosed in UK Pat. No. 772,675 and U.S. Pat. No. 4,381,945, which are hereby incorporated by reference herein, that will decompose into finely divided powders of metal oxides during the firing of the system (See also U.S. provisional patent application No. 60/674,433, which is hereby incorporated by reference herein).

Suitable inorganic borides particularly applicable to PTOS conductors and via-fills include, but not limited to, borides of titanium, borides of zirconium etc., and mixtures thereof (See also U.S. provisional patent application No. 60/703,530, which is hereby incorporated by reference herein). These borides of titanium and borides of zirconium may be present in the composition as non-oxide borides. It is believed that the borides will react with oxygen on firing and form either oxy-borides and/or metal oxide in close contact with boron oxide resulting higher molecular volume/unit cell volume than that of the parent metal boride.

The particle size of the metal oxides, or borides or precursors should be the size appropriate to the manner in which the composition of the invention is applied, which usually by screen printing, thus the particle size should be no larger than 15 um and preferably should be below 5 um.

D. Organic Medium

The inorganic particles are mixed with an inert liquid medium (vehicle) by mechanical mixing (e.g. on a roll mill) to form a paste-like composition having suitable consistency and rheology for screen printing and/or stencil applying. The latter is printed as a "thick film" on LTCC Green tapes in the conventional manner or on PTOS as described in U.S. Patent application No. 60/703,530. Any inert liquid may be used as the vehicle. Various organic liquids, with or without the thickening and/or stabilizing agents and/or other common additives may be used as the vehicle. The only specific criteria of the vehicle is that it must be chemically compatible to the organics present in the LTCC Green tapes. Exemplary of organic liquids which can be used are the aliphatic alcohols, esters of such alcohols, for example, acetates and propionates, terpenes such as pine oil, terpinol and the like, texanol and the like, solutions of resins such as ethyl cellulose in solvents as pine oil, and the monobutyl ether of ethylene glycol monoacetate. The vehicle may contain volatile liquids to promote fast setting after application to the tape.

In the case of the present invention, the resin used has ethyl cellulose structure with ethoxyl content of 45.0-51.5% and in one embodiment an ethoxyl content of 48.0-49.5% (N-type) and degree of substitution of ethoxyl groups per anhydroglucose unit of 2.22 to 2.73. In one embodiment, the degree of substitution of ethoxyl groups per anhydroglucose unit is in the range of 2.46-2.58 (N-type). One embodiment of the resin of the present invention is Aqualon® provided by Hercules Incorporated, Wilmington Del. The viscosity range of the resin (determined using 5% ethylcellulose in 80 parts toluene: 20 parts ethanol by weight) is 5.6 to 24 cps. In one embodiment, the range is 18-24 cps.

Figure 1A:
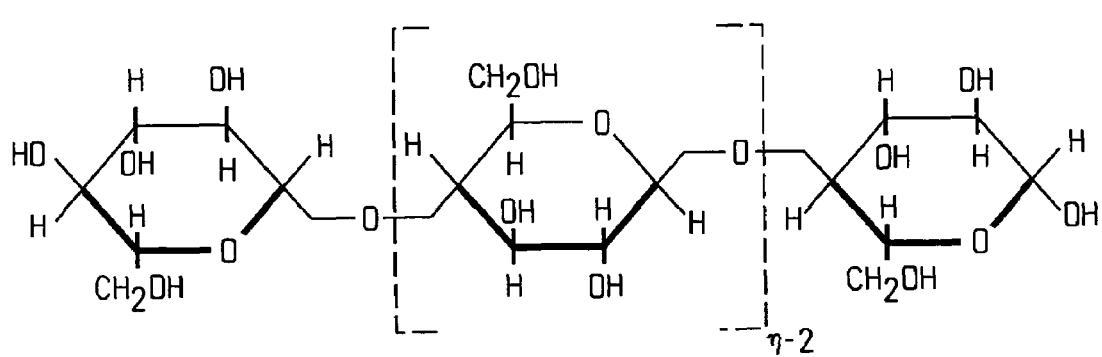
FIGS. 1a & 1b.
Figure 1B:
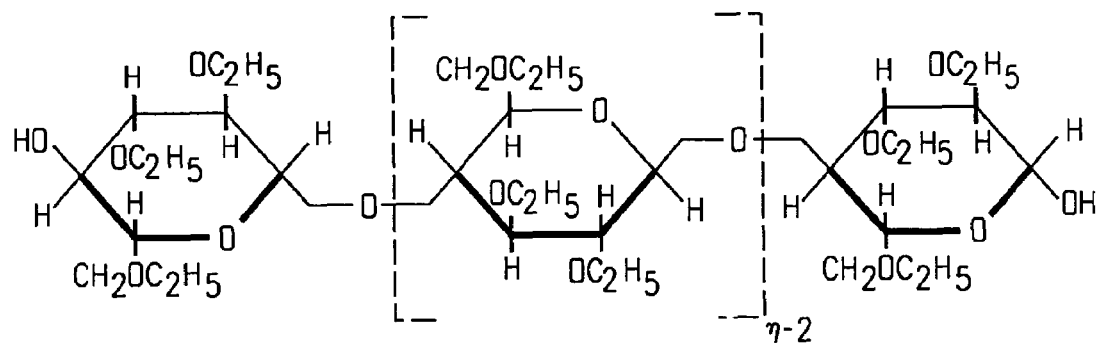

A typical structure of ethyl cellulose with complete (54.88%) ethoxyl substitution is given in FIG. 1 along with the structural formula of cellulose molecule. The solvent vehicle is preferably texanol with a chemical formula: 2,2,4 Trimethyl-1,3-pentanediol monoisobutyrate Propionic acid, 2-methyl-, monoester with 2,2,4-trimethyl-1,3-pentanediol isobutyric acid ester with 2,2,4-trimethyl-1,3-pentanediol (composition as listed in the "International Labor Organization", ICSC:0629 November 2003). The viscosity of the medium (resin dissolved in organic vehicle solvent) used in this invention as measured using RVT No 5 @ 10 RPM is 5.0-30.0 PaS, and preferably 7.5 to 10.5 PaS. In one embodiment the viscosity of the medium is in the range of 10-15 PsS. Another solvent which may be used is 3-cyclohexane-1-methanol, alpha,alpha,4-trimethyl-terpene alcohol described in JT Baker Inc, Phillipsburg, N.J.

The ratio of vehicle to solids in the dispersions can vary considerably and depends upon the manner in which the dispersion is to be applied. Normally to achieve good coverage the dispersions will contain complementally, 60-98% solids and 40-2% vehicle. The compositions of the present invention may, of course, be modified by the addition of other materials which do not affect its beneficial characteristics. Such formulations is well within the skill of those in the art.

II. Photosensitive Tape on Substrate (PTOS) Applications—Dielectric Tape Composition The dielectric thick film tape composition and application described below are described in detail in U.S. patent application Ser. No. 10/910,126 to Bidwell, herein incorporated by reference. The via-fill and/or line thick film conductor composition(s) of the present invention are particularly useful in PTOS applications utilizing the below identified dielectric tape composition(s). These PTOS applications represent one embodiment of the present invention's application and use.

Inorganic Binder

The inorganic binder ideally should be non-reactive, but in reality, may be reactive with respect to the other materials in the system. It is selected to possess the desired electrically insulative characteristics and have the appropriate physical properties relative to any ceramic solids (fillers) in the body.

The particle size and particle size distribution of the inorganic binder and any ceramic solids are not narrowly critical, and the particles will usually be between 0.5 and 20 μm in size. The $D_{50}$ (median particle size) of frit is preferably in the range of, but not limited to, 1 to 10 μm and more preferably 1.5 to 5.0 μm.

The basic physical properties that are preferred for the inorganic binder are (1) that it have a sintering temperature below that of any ceramic solids in the body, and (2) that it undergo viscous phase sintering at the firing temperatures used.

The glass of the dielectric composition is a family of amorphous, partially crystallizable alkaline earth zinc silicate glass compositions. These compositions are disclosed in U.S. Pat. No. 5,210,057 to Haun et al., which is incorporated herein.

Figure 2:
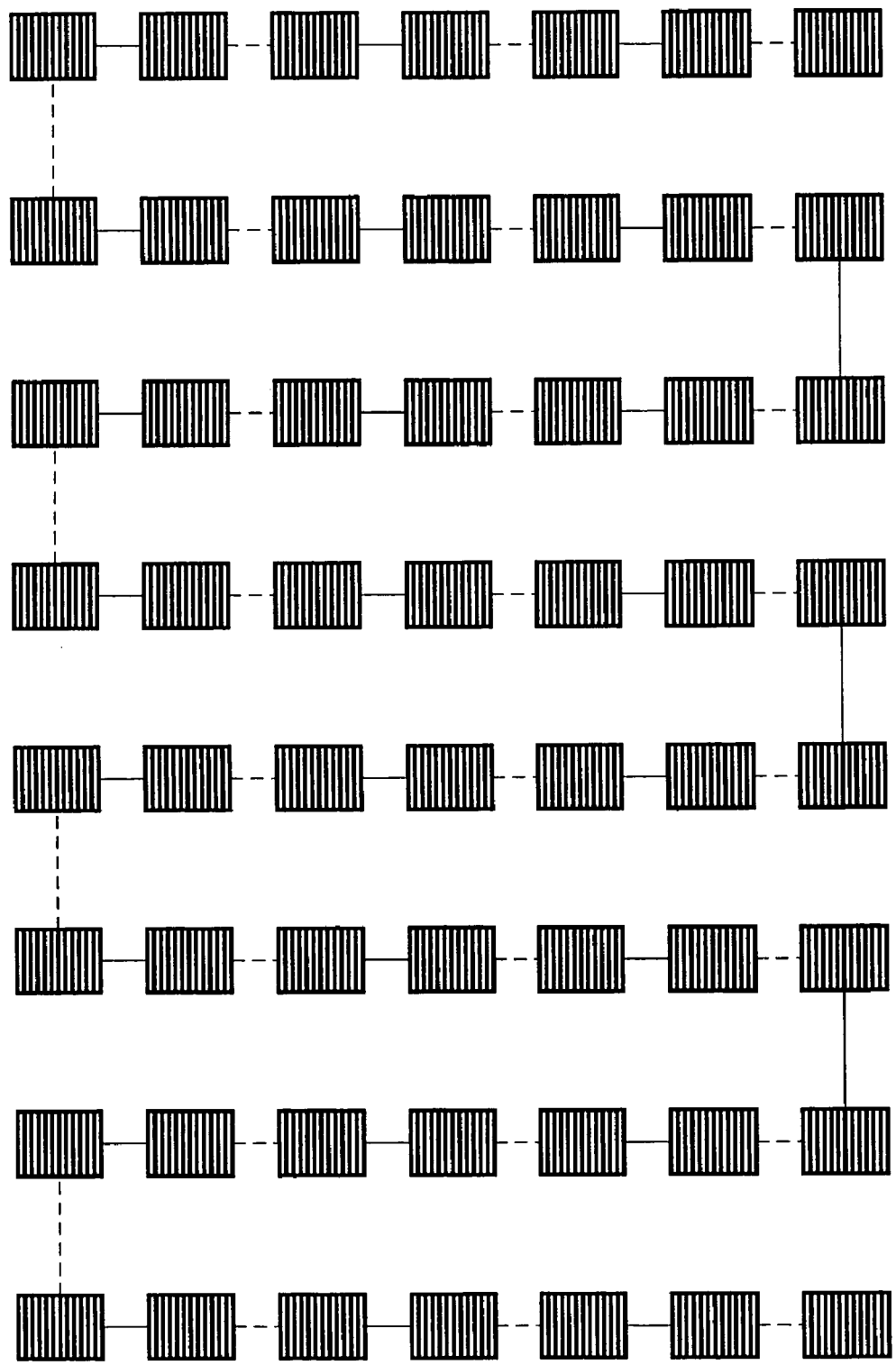
FIG. 2: "Daisy chain test pattern" consisting of 308 via and 5133 squares of conductors. Conductor line width 6 mils.

Haun et al. discloses an amorphous partially crystallizable alkaline earth zinc silicate glass consisting essentially of a composition falling within the area defined on a weight points g-l of FIG. 2 of the drawing, in which: (1) alpha is $SiO_2$ in admixture with a glass former or conditional glass former selected from the group consisting of no more than 3% $Al_2O_3$, 6% HfO2, 4% $P_2O_5$, 10% $TiO_2$, 6% ZrO2 and mixtures thereof, with the proviso that the composition contains at least 0.5% ZrO2; (2) beta is an alkaline earth selected from CaO, SrO, MgO, BaO and mixtures thereof, with the proviso that the composition contain no more than 15% MgO and no more than 6% BaO; and (3) gamma is ZnO, the loci of points g-l being as follows: point g—Alpha 48.0, Beta 32.0, Gamma 20.0; point h—Alpha 46.0, Beta 34.0, Gamma 20.0; point i—Alpha 40.0, Beta 34.0, Gamma 26.0; point j—Alpha 40.0, Beta 24.0, Gamma 36.0; point k—Alpha 46.0, Beta 18.0, Gamma 36.0; point k—Alpha 46.0, Beta 18.0, Gamma 36.0; point l—Alpha 48.0, Beta 19.0, Gamma 33.0.

Haun et al. further discloses the glass described in the above paragraph in which alpha contains $Al_2O_3$ up to 3% plus ⅔ of the % of BaO if any; and constitutes with respect to the total glass composition no more than 48% plus the % of BaO; beta contains up to 6% BaO and constitutes with respect to the total glass composition no more than 33% plus ½ of the % of BaO if any; and gamma constitutes no more than 36% minus ⅓ of the % of BaO if any.

Haun et al. further discloses the glasses described above which further contains both $Al_2O_3$ and P2O5, added as $AlPO_4$ or $AlP_3O_9$.

The glass utilized in one Pb-free, Cd-free embodiment of the dielectric composition relates to an alkali-alkaline earth-alumino-borosilicate glass composition comprising, in mole %, 46-66% $SiO_2$, 3-9% $Al_2O_3$, 5-9% $B_2O_3$, 0-8% MgO, 1-6% SrO, 11-22% CaO, and 2-8% M wherein M is selected from oxides of the group of alkali elements and mixtures thereof. Alkali elements are found in group IA of the periodic table. For example, the alkali element oxide may be selected from $Li_2O$, $Na_2O$, $K_2O$ and mixtures thereof. The molar ratio of SrO/(Ca+MgO) is between about 0.06 to about 0.45. This ratio range is necessary to assure compatibility properties with conductor materials used in conjunction with the LTCC tape of this invention.

In this Pb-free and Cd-free embodiment, the content of alkali and alkaline earth modifier in the glass is believed to increase the thermal expansion coefficient of glass while providing glass viscosity reduction critical to processing LTCC tape materials. Although the alkaline earth oxide, BaO, could be used to make an LTCC tape, it is found to reduce the chemical resistance, due to its ease of leaching in low pH solutions. For this reason, superior chemical resistance is found for alkaline earth modifier constituents within the ratio limits and mole percents defined above. Strontium oxide imparts superior solderability and low conductor resistivity in conductor material systems applied to outer layers of the tape. The content of strontium oxide in the glass, provides this improved conductor performance when present in the glass at levels including and exceeding 1 mole %. Data show that levels of 1 to 6 mole % provide improved conductor performance. A preferred level of strontium oxide is 1.8-3.0 mole %. The existence of the alkali oxides in the glass when used in a green tape improves the sensitivity of the glass to thermal process conditions by controlling the densification and crystallization behavior of the tape. The crucial role of the alkali addition is to provide required flow and densification characteristics to the tape at a desired firing temperature. It performs the function of glass viscosity reduction without affecting required physical and electrical performance of the tape. The type and amounts of alkali ions used to modify the viscosity properties of the glass also have an effect on the electrical loss characteristics of the tape made from the glass.

The glasses described herein may contain several other oxide constituents. For instance, $ZrO_2$, $GeO_2$, and $P_2O_5$ may be partially substituted for $SiO_2$ in the glass as follows, in mole % based on total glass composition: 0-4 mole % $ZrO_2$, 0-2 mole % $P_2O_5$, and 0-1.5 mole % $GeO_2$. Additionally 0-2.5 mole %, based on total glass composition, CuO may be partially substituted for the alkali and/or the alkaline earth constituents. A factor for the suitability of an LTCC tape formulation utilizing glass as a constituent is the required compatibility with conductors, and passive materials utilized as circuit components within and on the surface of the tape. This includes physical constraints such as suitable thermal expansion and the attainment of suitable levels of density and strength of the tape, the latter of which is enabled by the suitability of the glass viscosity to provide a tape in the required thermal processing temperature range.

The glasses described herein are produced by conventional glass making techniques. More particularly, the glasses may be prepared as follows. Glasses are typically prepared in 500-1000 gram quantities. Typically, the ingredients are weighted, then mixed in the desired proportions, and heated in a bottom-loading furnace to form a melt in a platinum alloy crucible. Heating is typically conducted to a peak temperature (1500-1550° C.) and for a time such that the melt becomes entirely liquid and homogeneous. The glass melts are then quenched by pouring on the surface of counter rotating stainless steel rollers to form a 10-20 mil thick platelet of glass or by pouring into a water tank. The resulting glass platelet or water quenched frit is milled to form a powder with its 50% volume distribution set between 1-5 microns. The resulting glass powders are formulated with filler and medium into thick film pastes or castable dielectric compositions.

The glass when incorporated into a tape is compatible with co-fired thick film conductor materials. The glass in the tape does not flow excessively upon firing. This is due to the partial crystallization of the glass, which is initiated by the reaction between a ceramic filler, typically $Al_2O_3$, and the glass. The glass, which remains following the partial crystallization, is changed to a more refractory glass. This eliminates staining of the tape with the conductor material and allows solder wetting or chemical plating of the thick film conductor material. Solder wetting is an important feature to allow connection of the ceramic circuit to external wiring such as on a printed circuit board. If chemical plating of thick film conductors is applied to surface layers of the tape, low pH plating baths can release ions from the surface of the tape contaminating the plating bath. For this reason, the glass found in the tape minimizes the release of glass constituents by chemical corrosion in reduced pH solutions. Additionally, the glass found in the tape also minimizes the release of glass constituents by chemical corrosion in strong basic solutions.

Optional Ceramic Solids

The ceramic solids are optional in the dielectric composition of the invention. When added, they are selected to be chemically inert with respect to the other materials in the system, possess the desired electrically insulative properties and to have the appropriate physical properties relative to the inorganic binder and photosensitive components of the compositions. Basically, the solids are fillers, which adjust properties such as thermal expansion and dielectric constant.

The physical properties most desirable of the ceramic solids in the dielectric are (1) that they have sintering temperatures above the sintering temperatures of the inorganic binder, and (2) that they do not undergo sintering during the firing step of the invention. Thus, in the context of this invention, the term "ceramic solids: refers to inorganic materials, usually oxides, which undergo essentially no sintering and have a limited tendency to dissolve in the inorganic binder under the conditions of firing to which they are subjected in the practice of the invention.

Subject to the above criteria, virtually any high melting inorganic solid can be used as the ceramic solids component of dielectric tape to modulate the electrical dielectric performance (e.g., K, DF, TCC) as well as the physical characteristics of the dielectric after firing. Examples of possible ceramic filler additives include $Al_2O_3$, $ZrO_2$, $TiO_2$, $BaTiO_3$, $CaTiO_3$, $SrTiO_3$, $CaZrO_3$, $SrZrO_3$, $BaZrO_3$, $CaSnO_3$, $BaSnO_3$, $PbTiO3$, metal carbides such as silicon carbide, metal nitrides such as aluminum nitride, minerals such as mullite and kyanite, cordierite, zirconia, forsterite, anorthite, and various forms of silica or mixtures thereof.

Ceramic solids may be added to the dielectric composition in an amount of 0-50 wt. % based on solids. Depending on the type of filler, different crystalline phases are expected to form after firing. The filler can control dielectric constant and thermal expansion properties. For example, the addition of $BaTiO_3$ can increase the dielectric constant significantly.

$Al_2O_3$ is the preferred ceramic filler since it reacts with the glass to form an Al-containing crystalline phase. $Al_2O_3$ is very effective in providing high mechanical strength and inertness against detrimental chemical reactions. Another function of the ceramic filler is rheological control of the entire system during firing. The ceramic particles limit flow of the glass by acting as a physical barrier. They also inhibit sintering of the glass and thus facilitate better burnout of the organics. Other fillers, □-quartz, $CaZrO_3$, mullite, cordierite, forsterite, zircon, zirconia, $BaTiO_3$, $CaTiO_3$, $MgTiO_3$, $SiO_2$, amorphous silica or mixtures thereof may be used to modify tape performance and characteristics.

In the formulation of tape compositions, the amount of glass frit (glass composition) relative to the amount of ceramic (filler) material is important. A filler range of 10-40% by weight is considered desirable in that the sufficient densification is achieved. If the filler concentration exceeds 50% by wt., the fired structure is not sufficiently densified and is too porous. Within the desirable glass/filler ratio, it will be apparent that, during firing, the liquid glass phase will become saturated with filler material.

For the purpose of obtaining higher densification of the composition upon firing, it is important that the inorganic solids have small particle sizes. In particular, substantially all of the particles should not exceed 15 μm and preferably not exceed 10 μm. Subject to these maximum size limitations, it is preferred that at least 50% of the particles, both glass and ceramic filler, be greater than 1.0 μm and less than 6 μm.

The specific type of glass chemistry is not critical to the embodiment of this invention, and can contain a wide range of possible constituents, depending on the specific application where the photosensitive tape is to be used. Several glass compositions are detailed in Table 1 below. For example, in situations where a lead based glass would be acceptable, a glass such as Glass A might be incorporated. For applications where lead-containing glass is not acceptable, but where high reliability dielectric properties are still needed after firing the tape composition at 850 degrees C., a glass of the type "B" might be incorporated. Still further to the broad potential applications where the embodiment might be applied, Glass C describes a chemistry that could be used in applications where low firing temperatures are needed because of the type of substrate to be used, i.e., such as soda lime glass substrates.

TABLE 1

Examples of Glass Compositions and Solids Compositions Useful in PTOS Applications

| Ingredients | Solids A | Solids B | Solids C |
|---|---|---|---|
| Glass A | 27.6 | 0 | 0 |
| Glass B | 0 | 42.2 | 0 |
| Glass C | 0 | 0 | 49 |
| Alumina | 21.7 | 18.9 | 16.3 |
| Cobalt Aluminate | 0.3 | 0.2 | 0 |

| Ingredients | Glass A | Glass B | Glass C |
|---|---|---|---|
| PbO | 17.2 | 0 | 0 |
| SiO2 | 56.5 | 38.64 | 7.11 |
| B2O3 | 4.5 | 0 | 8.38 |
| Na2O | 2.4 | 0 | 0 |
| K2O | 1.7 | 0 | 0 |
| MgO | 0.6 | 0 | 0 |
| CaO | 8 | 14.76 | 0.53 |
| Al2O3 | 9.1 | 0 | 2.13 |
| BaO | 0 | 12.66 | 0 |
| ZrO2 | 0.0 | 2.5 | 0.0 |
| ZnO | 0 | 29.97 | 12.03 |
| P2O5 | 0 | 1.45 | 0 |
| Bi2O3 | 0 | 0 | 69.82 |

Tables 2 and 3 detail the typical Particle Size Distribution (PSD) in microns for the Glass Powders "A" and "B" in Table 1.

TABLE 2

Glass A PSD, microns (typical)

| D(10) | D(50) | D(90) | D(100) |
|---|---|---|---|
| 0.774 | 2.118 | 4.034 | 9.25 |
| 0.832 | 2.598 | 5.035 | 11.00 |

TABLE 3

| Glass B PSD, microns (typical)D10 0.95-1.05 | |
|---|---|
| D(10) | 0.95-1.05 microns |
| D(50) | 2.4-3.0 microns |
| D(90) | 5.0-6.5 microns |

Organic Constituents

Polymeric Binder

The organic constituents in which the amorphous glass powder and optional ceramic inorganic solid powders are dispersed is comprised of one or more acrylic-based polymeric binders, one or more photosensitive acrylic-based monomers which will cross link and provide differentiation after exposure to UV actinic light, one or more initiator which facilitates the photo process and one or more plasticizers, all of which are dissolved in a volatile organic solvent. The "slurry" or combination of all the organic ingredients and the inorganic powders comprised of the amorphous glass powder and the optional inorganic "filler" additives is commonly referred to as the "slip" by those familiar in the art and, optionally, other dissolved materials such as release agents, dispersing agents, stripping agents, antifoaming agents, stabilizing agents and wetting agents.

Once the wet "slip" has been coated on to a suitable backing material at the desired thickness and has been dried to get rid of all low boiling solvent, the photosensitive "tape" results.

The polymer binder(s) are critical to the composition of the dielectric composition for PTOS applications. Additionally, the polymer binders render the dielectric tape to be developable in an aqueous base solution of 0.4%-2.0 weight % base ($Na_2CO_3$ or $K_2CO_3$), allowing high resolution of features exposed to the UV actinic radiation, and furthermore, giving good green strength, flexibility and lamination properties of the cast tape. The polymer binders are made of copolymer, interpolymer or mixtures thereof, wherein each copolymer or interpolymer comprises (1) a nonacidic comonomer comprising a $C_{1-10}$ alkyl acrylate, $C_{1-10}$ alkyl methacrylate, styrenes, substituted styrenes, or combinations thereof and (2) an acidic comonomer comprising ethylenically unsaturated carboxylic acid containing moiety, the copolymer, interpolymer mixture having an acid content of at least 15% by weight. The mixture may comprise copolymers, interpolymers or both. The acidic polymer binder must be developed by a solution containing a basic component.

The presence of acidic comonomer components in the composition is important in this technique. The acidic functional group provides the ability to be developed in aqueous bases such as aqueous solutions of 0.4-2.0 weight % sodium carbonate or potassium carbonate. When acidic comonomers are present in concentrations of less than 10%, the composition is not washed off completely with an aqueous base. When the acidic comonomers are present at concentrations greater than 30%, the composition is less resistant under development conditions and partial development occurs in the imaged portions. Appropriate acidic comonomers include ethylenically unsaturated monocarboxylic acids such as acrylic acid, methacrylic acid, or crotonic acid and ethylenically unsaturated dicarboxylic acids such as fumaric acid, itaconic acid, citraconic acid, vinyl succinic acid, and maleic acid, as well as their hemiesters, and in some cases their anhydrides and their mixtures.

It is preferred that the nonacidic comonomers constitute at least 50 wt % of the binder polymer. Although not preferable, the nonacidic portion of the polymer binder can contain up to about 50 wt. % of other nonacidic comonomers as substitutes for the alkyl acrylate, alkyl methacrylate, styrene, or substituted styrene portions of the polymer. Examples include acrylonitrile, vinyl acetate, and acrylamide. However, because it is more difficult for these to completely burn out, it is preferable that less than about 25 wt. % of such monomers in the total polymer binder are used.

The use of single copolymers or combinations of copolymers as binders are recognized as long as each of these satisfies the various standards above. In addition to the above copolymers, adding small amounts of other polymer binders is possible. For examples of these, polyolefins such as polyethylene, polypropylene, polybutylene, polyisobutylene, and ethylene-propylene copolymers, polyvinyl alcohol polymers (PVA), polyvinyl pyrrolidone polymers (PVP), vinyl alcohol and vinyl pyrrolidone copolymers, as well as polyethers that are low alkylene oxide polymers such as polyethylene oxide can be cited.

The polymers described herein can be produced by those skilled in the art of acrylate polymerization by commonly used solution polymerization techniques. Typically, such acidic acrylate polymers are produced by mixing α- or β-ethylenicially unsaturated acids (acidic comonomers) with one or more copolymerizable vinyl monomer (nonacidic comonomers) in a relatively low-boiling-point (75-150° C.) organic solvent to obtain a 10-60% monomer mixture solution, then polymerizing the monomers by adding a polymerization catalyst and heating the mixture under normal pressure to the reflux temperature of the solvent. After the polymerization reaction is essentially complete, the acidic polymer solution produced is cooled to room temperature.

A reactive molecule, a free radical polymerization inhibitor and a catalyst are added to the cooled polymer solution described above. The solution is stirred until the reaction is complete. Optionally, the solution may be heated to speed up the reaction. After the reaction is complete and the reactive molecules are chemically attached to the polymer backbone, the polymer solution is cooled to room temperature, samples are collected, and the polymer viscosity, molecular weight, and acid equivalents are measured.

Plasticizer

Plasticizer is essential to the dielectric thick film tape utilized in the PTOS applications. The use of the plasticizer in the is optimized to satisfy several properties of the tape both before, during and after the hot roll lamination process has occurred to allow for hot roll lamination by providing a flexible conformal tape composition. If too much plasticizer is used, the tape will stick together. If too little plasticizer is used, the tape may chip during processing. The plasticizer, in combination with the polymer binder of the composition, contributes to the desired adhesive properties of the tape, thus allowing the tape film to adhere to the substrate upon hot roll lamination.

Additionally, the plasticizer serves to lower the glass transition temperature (Tg) of the binder polymer. The ratio of plasticizer to polymer binder is in the range of 4:23 to 7:9. The plasticizer is present in the total composition in 1-12 wt. %, more preferably 2-10%, and most preferably, 4-8% by weight of the total dried tape composition.

The choice of plasticizers, of course, is determined primarily by the polymer that needs to be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations. Preferred plasticizers are BENZOFLEX® 400 as well as BENZOFLEX® P200 manufactured by the Velsicol Company, which are a polypropylene glycol dibenzoate, and polyethylene glycol dibenzoate, respectively.

Photoinitiation System (Photoinitiator)

Suitable photoinitiation systems are those which are thermally inactive, but which generate free radicals upon exposure to actinic radiation at or below 185° C. "Actinic radiation" means light rays, violet and ultraviolet light, X-rays, or other radiations by which chemical changes are produced. Certain photo initiators, even though thermally inactive, can generate free radicals at a temperature of 185° C. or lower under exposure to actinic radiation. Examples include substituted or non-substituted polynuclear quinones, compounds having two inner molecular rings in a conjugated carbon ring system, such as 9,10-anthraquinone, 2-methylanthraquinone, 2-ethylanthraquinone, 2-tert-butylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethylanthraquinone, 2,3-dimethylanthraquinone, 2-phenylanthraquinone, 2,3-diphenylanthraquinone, retene quinone, 7,8,9,10-tetrahydronaphthacene-5,12-dione, and 1,2,3,4-tetrahydrobenz(a)anthracene-7,12-dione. U.S. Pat. No. 2,760,863 disclosed some other useful optical initiators that are thermally active even at a temperature as low as 85° C. They are vicinal (vicinal) ketal donyl alcohols such as benzoin, and pivaloin, acyloin ethers such as benzoin methyl and ethyl ether, as well as α-hydrocarbon-substituted aromatic acyloins such as α-methylbenzoin, α-allylbenzoin, and α-phenylbenzoin.

The photoreductive dyes and reducing agents disclosed in U.S. Pat. Nos. 2,850,445, 2,875,047, 3,097,096, 3,074,974, 3,097,097, 3,145,104, 3,427,161, 3,479,186, and 3,549,367, such as phenatine, oxatine, and Michler's ketone (Michler's ketone) of the quinone class, benzophenone, and 2,4,5-triphenylimidazole dimer having hydrogen suppliers can be used as the initiators. Also, the sensitizer disclosed in U.S. Pat. No. 4,162,162 can be used together with the optical initiator and photopolymerization inhibitor. The content of the optical initiator varies. In one embodiment, the content of the optical initiator is in the range of 0.02-12 weight % with respect to the total weight of the dried photopolymerizable tape film layer. In a further embodiment, the optical initiator is present in the range of 0.1-3 weight %, and in still a further embodiment the optical initiator is present in the range of 0.2-2 weight %. One particularly useful photo initiator for the practice of this embodiment is Irgacure® 369 manufactured by Ciba Specialty Chemicals.

Photohardenable Monomer

The photocurable monomer component used in the dielectric tape is formed with at least one addition polymerizable ethylene type of unsaturated compound having at least one polymerizable ethylene group.

This compound is made from free radicals, then grown into chains, which are subjected to addition polymerization to form a polymer. The monomer compound is non-gaseous. In other words, it has a boiling point of 100° C. or higher and can be plasticized on an organic polymerizable binder.

Examples of appropriate monomers that can be used either alone or in combination with other monomers include t-butyl acrylate and methacrylate, 1,5-pentanediol diacrylate and dimethacrylate, N,N-dimethylaminoethyl acrylate and methacrylate, ethylene glycol diacrylate and dimethacrylate, 1,4-butanediol acrylate and methacrylate, diethylene glycol, diacrylate and dimethacrylate, hexamethylene glycol diacrylate and methacrylate, 1,3-propanediol diacrylate and dimethacrylate, decamethylene glycol diacrylate and methacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate, and methacrylate, polyoxyethylated trimethylolpropane triacrylate and trimethacrylate, and the same compounds disclosed in U.S. Pat. No. 3,380,381, 2,2-di(p-hydroxyphenyl)-propane diacrylate, pentaerythritol tetraacrylate and tetramethacrylate, 2,2-di-(p-hydroxyphenyl)-propanediacrylate, pentaerythritol tetraacrylate and tetramethacrylate, 2,2-di(p-hydroxyphenyl)-propanedimethacrylate, triethylene glycol diacrylate, polyoxyethyl-1,2-di-(p-hydroxyphenyl)propane dimethacrylate, di-(3-methacryloxy-2-hydroxypropyl)ether of bisphenol-A, di-(3-acryloxy-2-hydroxypropyl)ether of bisphenol A, di(2-methalkyloxyethyl)ether of bisphenol-A, di(2-acryloxyethyl)ether of bisphenol-A, di-(3-methalkyloxy-2-hydroxypropyl)ether of 1,4-butanediol, triethylene glycol dimethacrylate, polyoxypropyl trimethylol propanetriacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenylethylene-1,2-dimethacrylate, diallyl fumarate, styrene, 1,4-benzenediol dimethacrylate, 1,4-diisopropenylbenzene, and 1,3,5-triisopropenylbenzene.

It is also possible to use ethylene-type unsaturated compounds having a molecular weight of at least 300, such as the alkylene or polyalkylene glycol diacrylate manufactured from a C2-15 alkylene glycol or polyalkylene glycol having 1-10 ether bonds as well as the compounds disclosed in U.S. Pat. No. 2,927,022, especially those compounds having multiple addition polymerizable ethylene bonds when they are present as the terminal bonds.

Preferable examples of the monomers include polyoxyethylated trimethylolpropane triacrylate and trimethacrylate, ethylated pentaerythritol triacrylate, trimethylol propane triacrylate and trimethacrylate, dipentaerythritol monohydroxy pentaacrylate, and 1,10-decanediol dimethyl acrylate.

Other preferable monomers include monohydroxypolycaprolactone monoacrylate, polyethylene glycol diacrylate (molecular weight: about 200), and polyethylene glycol 400 dimethacrylate (molecular weight: about 400). The content of the unsaturated monomer component is preferably in the range of 2-20 wt % of the total weight of the dried photopolymerizable tape film layer, more preferably 2-12% and most preferably, 2-7% of the dry tape film layer. One particularly useful monomer for the practice of this embodiment is CD582, also known as alkoxylated cyclohexane diacrylate, manufactured by Sartomer Company.

Organic Solvent

The solvent component of the casting solution is chosen so as to obtain complete dissolution of the polymer and sufficiently high volatility to enable the solvent to be evaporated from the dispersion by the application of relatively low levels of heat at atmospheric pressure. In addition, the solvent must boil well below the boiling point or the decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1,3-monoisobutyrate, toluene, methylene chloride and fluorocarbons. Individual solvents mentioned above may not completely dissolve the binder polymers. Yet, when blended with other solvent(s), they function satisfactorily. This is well within the skill of those in the art. A particularly preferred solvent is ethyl acetate since it avoids the use of environmentally hazardous chlorocarbons.

Additional components known in the art may be present in the dielectric composition including dispersants, stabilizers, release agents, dispersing agents, stripping agents, antifoaming agents and wetting agents. A general disclosure of suitable materials is presented in U.S. Pat. No. 5,049,480, which is incorporated herein.

APPLICATIONS

Tape Preparation

The dielectric composition(s) presented above are used to form a film as a wet slurry or "slip" on a suitable backing materials. The material which is often used for the backing is "mylar". Other possible backing materials might be polypropylene, nylon, and although not narrowly critical to the application, should have suitable properties to allow the satisfactory practice of the present invention. For example, the tape on the backing material after drying (the film when dried to remove the solvent is called "the tape") should have sufficient adhesion to the backing to stick together and not "delaminate" through the hot roll lamination step, but should easily come apart once the hot roll lamination step has been completed.

A conformable entity is defined as any structure comprising the dielectric composition noted above that allows for hot roll lamination. We will discuss the conformable entity in general terms of tape formation. To form the tape, a slip is prepared and used for tape casting. Slip is a general term used for the composition in tape making and is a properly dispersed mixture of inorganic powders dispersed in an organic medium.

Although it is not narrowly critical to the practice of the PTOS applications of the present invention, a common way of achieving a good dispersion of inorganic powders in the organic medium is by using a conventional ball-milling process. A ball milling consists of ceramic milling jar and milling media (spherical or cylindrical shaped alumina or zirconia pellets). The total mixture is put into the milling jar containing the milling media. After closing the jar with a leak-tight lid, it is tumbled to create a milling action of the milling media inside the jar at a rolling speed at which the mixing efficiency is optimized. The length of the rolling is the time required to attain well-dispersed inorganic particles to meet the performance specifications. Generally, a milling or mixing time of 1-20 hours is sufficient to result in the desired level of dispersion. The slip may be applied to a backing by a blade or bar coating method, followed by ambient or heat drying. The coating thickness after drying may range from a few microns to several tens of microns depending on the end application in which the tape will be used.

The conformable photosensitive dielectric "green" (i.e., "unfired") tape(s) for use in some embodiments of the present invention are formed by casting a layer of desired thickness of a slurry dispersion of inorganic binder, optional ceramic solids, polymeric binder, plasticizer, photoinitiator, photohardenable monomer, and solvent as described above onto a flexible backing and air drying or heating the cast layer to remove the volatile solvent. The backing may be made from a multitude of flexible materials, but is typically Mylar. The tape (coating+e.g., Mylar backing) may then be formed into sheets or collected in a roll form, and sized according to the dictates of the final application for which the tape is intended to be used. (NOTE: Once the tape has been applied to the rigid substrate by hot roll lamination, the backing is generally removed and discarded.)

The backing material for PTOS applications will usually remain together with the photosensitive ceramic-containing tape through the hot roll lamination stage and removed prior to exposure of the photosensitive tape. In the case where the backing material is a clear transparent Mylar, or other suitable material which allows exposure to UV actinic light, the backing material could remain on the tape surface even through exposure to the actinic UV light, for example to provide protection of the surface from unwanted contaminations. In this case, the transparent backing material would be removed just before the development step.

It is preferred that the dried tape not exceed a thickness of 65-75 mils. Thicker tapes will often create problems during the firing step when using conventional belt furnaces with total firing cycle times of 30-60 minutes (defined as total time above 100 deg C.). In cases where thicker films are required by the application, it would be possible to circumvent the firing sensitivity by using an elongated firing profile not practically feasible for many hybrid circuit manufacturers.

Additionally, a cover sheet may be applied to the tape before it is wound as a "widestock" (master) roll. Examples of typical coversheets include, mylar, silicone coated mylar (terephthalate PET), polypropylene, and polyethylene, or nylon. Typically, the coversheet is removed just before hot roll lamination to the final rigid substrate.

Suitable Dimensionally Stable Substrates

A "dimensionally stable substrate" as described herein is any solid material, including solid materials comprising ceramic, glass, and metal, which does not noticeably change shape or size under the firing conditions required to sinter and bond the film materials to the substrate. Suitable dimensionally stable substrates might include, but are not limited to, conventional ceramics such as alumina, α-quartz, $CaZrO_3$, mullite, cordierite, forsterite, zircon, zirconia, $BaTiO_3$, $CaTiO_3$, $MgTiO_3$, $SiO_2$, glass-ceramics, and glasses (amorphous structures, e.g., comprised of soda lime glass or higher melting amorphous structures), amorphous silica or mixtures thereof. Other suitable dimensionally stable substrate materials might be stainless steel, iron and its various alloys, porcelanized steel, other base metals such as nickel, molybdenum, tungsten, copper, as well as platinum, silver, palladium, gold and their alloys, or other precious noble metals and their alloys, and other metal substrates determined to be suitable based on their final application. In particular, one iron alloy that is a suitable substrate is Kovar® (Ni—Fe alloy) substrate. The tape can also be laminated to other electrical substrate assemblies already formed (fired), in order to customize the electrical circuit functionality further. Such substrates might be ceramic hybrid microelectronic circuits already fired on alumina, or circuits comprised of 951 "Green Tape™", 943 "Green Tape™" (both by E. I. du Pont de Nemours and Company), or other LTCC circuits which are now commercially available.

Multilayer Circuit Formation

The multilayer electric circuit is formed by supplying a dimensionally stable substrate, which can be any substrate compatible with the thermal coefficient of expansion (TCE)

of the conformable photosensitive dielectric tape after it has been fired on to the substrate material. Examples of dimensionally stable substrates include, but are not limited to, alumina, glass, ceramic, α-quartz, CaZrO$_3$, mullite, cordierite, forsterite, zircon, zirconia, BaTiO$_3$, CaTiO$_3$, MgTiO$_3$, SiO$_2$, amorphous silica or mixtures thereof. Other suitable substrate materials might be stainless steel, iron and its various alloys, porcelanized steel, other base metals such as nickel, molybdenum, tungsten, copper, as well as platinum, silver, palladium, gold and their alloys, or other precious noble metals and their alloys, and other metal substrates determined to be suitable based on their final application. The tape can also be laminated to other electrical substrate assemblies already formed (fired), in order to customize the electrical circuit functionality further. Such substrates might be ceramic hybrid microelectronic circuits already fired on alumina, or circuits comprised of 951 "Green Tape™", 943 "Green Tape™" (available from E. I. du Pont de Nemours and Company), or other LTCC circuits which are now commercially available.

The dimensionally stable substrate is then optionally coated with a functional or conductive layer, applied in the desired pattern by conventional screen printing or by commercially available photo definition techniques (e.g., the conductive composition of the present invention or other conductive composition such as Fodel® silver paste, product number 6453 from the E. I. du Pont de Nemours and Company. The conductive paste is typically dried at a suitable temperature to remove all solvent before proceeding. For the first metallization layer on the rigid substrate, the functional conductive film must be fired before applying the photosensitive dielectric tape layer.)

Next, the photosensitive dielectric "green" tape is hot-roll laminated to the dimensionally stable substrate. The photosensitive tape is then exposed in the desired pattern thus creating crosslinked or polymerized areas where actinic radiation was applied and uncrosslinked or unpolymerized areas, where the light was not applied. The uncrosslinked (unpolymerized) areas are then washed off using a dilute solution of 0.4-2.0% by weight of sodium or potassium carbonate, thus forming the desired pattern of vias or other desired structures (e.g., cavities, steps, walls). The e.g., vias may then be filled with a conductive metallization (i.e. the via fill composition of the present invention). Next, patterned functional conductive layer(s) (additional metallization layers) may be coated on the via filled tape layer to form a circuit assembly. One or more of these layers may also be formed from the conductive thick film composition of the present invention. After the first dielectric assembled layer has been fired, the process steps may be repeated as needed or desired, i.e., from the photosensitive tape hot-roll lamination to the functional layer coating, firing each assembled dielectric tape layer before proceeding to the next layer.

The interconnections between layers are formed by filling the via holes with a thick film conductive ink. This ink is usually applied by standard screen printing techniques. Each layer of circuitry is completed by screen printing conductor tracks. Also, resistor inks or high dielectric constant inks can be printed on selected layer(s) to form resistive or capacitive circuit elements.

As used herein, the term "firing" means heating the assembly in an oxidizing atmosphere such as air to a temperature, and for a time sufficient to volatilize (burn-out) all of the organic material in the layers of the assemblage to sinter any glass, metal or dielectric material in the layers and thus densify the entire assembly. Firing is typically performed in a belt furnace, such as manufactured by Sierra Therm, BTU, and Lindberg, among others.

The term "functional layer" refers to the conductive composition applied by screen printing, stenciling ink jetting or other methods to the tape, which has already been hot roll laminated to the dimensionally stable substrate. The functional layer can have conductive, resistive or capacitive functionality. Thus, as indicated above, each typical unfired tape layer may have printed thereon one or more combinations of resistor, capacitor, and/or conductive circuit elements, which will become functional once the assembly has been fired.

The composition(s) of the present invention may be used to make multilayer circuits of various types including LTCC multilayer circuits, MLI multilayer circuits (i.e., multilayer circuits made using thick film dielectric pastes instead of tapes), and PTOS multilayer circuits.

General Formulation and Application of the Present Invention

In the preparation of the compositions of the present invention, the particulate inorganic solids are mixed with the organic carrier and dispersed with suitable equipment, such as a three-roll mill, to form a suspension, resulting in a composition for which the viscosity will be in the range of 100-450 pascal-seconds at a shear rate of 4 sec-1. In some embodiments, the composition's viscosity is in the range of 100-200 pascal-seconds at a shear rate of 4 sec-1. This range is particularly useful in photosensitive tape on substrate applications. In other embodiments the viscosity of the composition is in the range of 250-450 pascal-seconds at a shear rate of 4 sec-1.

In the examples which follow, the formulation was carried out in the following manner: The ingredients of the paste are weighed together in a container. The components are then vigorously mixed to form a uniform blend; then the blend is passed through dispersing equipment such as a three roll mill, to achieve a good dispersion of particles. A Hegman gauge is used to determine the state of dispersion of the particles in the paste. This instrument consists of a channel in a block of steel that is 25 um deep (1 mil) on one end and rams up to 0" depth at the other end. A blade is used to draw down paste along the length of the channel. Scratches will appear in the channel where agglomerates' diameter is greater than the channel depth. A satisfactory dispersion will give you a fourth scratch point of 10-18 um typically. Fourth scratch measurements of >20 um and half channel measurements of >10 um indicate a poorly dispersed suspension/paste. The composition is then screened using a 500 mesh screen to remove larger particles, if any.

The composition is then applied to a substrate, such as alumina or similar refractory ceramics or Photoimageable tape on substrate (PTOS) as described in U.S. Patent application 60/703,530 or the "Green tape" as described in U.S. Patent application 60/674,433. For example, details of "Green tape" application is described below. A typical "Green tape" is formed by casting a 1-20 mil, preferably 2-10 mil, thin layer of a slurry dispersion of the glass and ceramic filler fine particulates, polymeric binder(s) and solvent(s) as described in the art of "tape casting" into a flexible substrate, heating the cast layer to remove the volatile solvent. The tape is blanked into sheets or in the roll form. This Green tape is used as an insulating substrate for multilayer electronic circuits/devices, in place of conventional substrates such as alumina and other refractory ceramic substrates. The Green tape sheet is blanked with registration holes at the four corners, and via holes to connect the different layers of conductors using mechanical punching. The size of via holes vary depending on circuit design and property requirements. The interconnections of circuit between conductor track layers of the tape are perform by screen printing the conductive inks in the via holes.

The conductive line compositions of the invention is applied to a sheet of Green tape, usually by the process of screen printing, to a wet thickness of about 10-30 um and preferably 15-20 um for conductor lines and the via holes are filled with the same ink at the same time.

After each layer of tape is printed with conductor lines and via holes as appropriate to the circuit design, the individual layers are collated, laminated and pressed using uniaxial or isostatic pressing die and techniques as described elsewhere in the art of tape pressing/lamination techniques. It will be recognized by those skilled in the art that in each of the laminating steps the printed tape layers must be accurate in registration so that the vias are properly connected to the appropriate conductive lines of the adjacent functional layer, and in the case of thermal vias, each via will be connected appropriately to the next one.

Firing to effect sintering of the Green tape compositions and of the inorganic binder as well as the finely divided particles of metal, is preferably done in a well ventilated belt conveyor furnace or programmed box furnace with a temperature profile that will allow de-polymerization of polymers; and/or burnout of the organic matter at about 300-600° C., a period of maximum temperature of about 800-950° C., lasting about 5-20 minutes, followed by a controlled cool down cycle to prevent over-sintering and crystal growth, unwanted chemical reactions at intermediate temperatures, or substrate/fired ceramic tape fracture from too rapid cool down. The overall firing procedure will preferably extend over a period of between 3.5 to 5 hours, and in certain cases it could take up to 24 hours or more depending on the number of layers of Green tapes laminated together and/or the thickness of the Green tape layers.

The fired thickness of the conductor can range from about 5 to about 15 um, depending on the percent of solids, the type of screen the composition is printed with, the printer set up, and degree of sintering of the inorganic solids. The thickness of via conductors vary depending on the thickness of the Green tape used and degree of sintering of the via composition. In order to avoid two major defects, dimpling and posting of the vias, the selection of viscosity and solid content of the composition is important. In general, increased solid content could result in posting and lower solid content will result in dimpling.

The conductor compositions of this invention can be printed as film onto the Green tapes or ceramic substrates, or onto other thick films either by using an automated printer or a hand printer in the conventional manner. Preferably, automation screen printing techniques are employed, using 200 to 325 mesh screen with 0.5 um emulsion thickness. Conventional stencil printing techniques are also can be used, particularly for filling the smaller vias of size 4-8 um.

Printing and Heat Processing Thicker Tapes

Many applications need fast printing, thicker tapes and large number of layers for miniaturization of the devices. Conventional LTCC thick film via-fill compositions printed through the tape-side. Many device manufactures prefer to print on the tape-baking side to improve productivity and print quality. In the case of thicker tapes such as 10 mil, print-dry, print-dry mode and/or very slow printing are used to fill the vias without dimpling and/or posting. The compositions described in this invention could be single printed and fast. Also single printing could fill the vias and line conductors in one print reducing the processing cost significantly.

For example some via printing conditions for LTCC (943-KX) tape (E.I. du Pont de Nemours and Company) and parameters are listed below.
(1) 10 mil vias in 943-KX tape (E.I. du Pont de Nemours and Company) with backing
(2) Wet print flat or button shape
(3) Dried flat and hard
(4) Consistent fill through 25-100 automated cycles
(5) Filled from p-backing side
(6) No "peaking" or sharp "posting"
(7) Clean flat consistent backing separation
Two different printing parameters listed below are used to print one of the metallization of this invention using two different printers: Micro Tec and 9156 AMI:

|  | Micro Tec. | 9156 AMI |
|---|---|---|
| Squeegee | Blue 80 shor @ 40 o angle | White 80 Shor @ 40° angle |
| Pressure | 300 mpa | As required |
| Vacuum | 50 Hz | 5-15 In/Hg |
| via Size | same for both: "350 um stencil hole (250 um via hole)" | |
| Drying rate | 80° C. for 10 min. | 80° C. for 10 min. |
| Snap off | 10-30 mils | 35-40 mils |
| Squeegee speed | 1.9 in/sec. | 1.9 in/sec. |
| Stencil | same for both: "4 mil SS laser drilled" | |
| Flood bar | same for both: "Flooding paste required" | |
| Printing area | 8.9" | 5" |

After the printing tapes are evaluated for quality of prints and showed excellent results: (1) wet print characteristics (good flood back behavior, button shaped print, no "peaking" on tape side after removal from tissue) (2) dried print characteristics (no slumping after drying, flat or button shaped via after backing removal, minimal dried flaking after backing removal). The printed tapes are laminated and thermal processed using a specific 26.5 heating profile to a maximum temperature of 850° C. Properties of the film were evaluated and showed good results: (1) fired characteristics (complete electrical interconnection, low posting) (2) SEM cross section microstructure (non-differential contact between layers of vias, uniform grain structure/microstructure throughout 25 layers of connected thermal vias.)

All these above listed properties are get or even impossible to get using standard via-fill compositions, standard via fill printing and standard tape thermal processing of 3.5 hours and 850° C. Maximum temperature.

Reliability Test Procedures

In the examples below, the resistance variation is measured in the following manner:

Samples to be tested for resistance variation after repeated firing are prepared as follows:

A "daisy chain" pattern shown in FIG. 2 of the conductor formulation to be tested is screen printed upon green sheets of tapes, laminated, and fired in a belt furnace using a "tape heating and cooling profile" as described earlier. The "daisy chain" pattern consists of 5133 squares of conductor lines and 318 via-fill conductors connected in series. Any break in the line conductors and/or via-fill connections will result in the infinite resistance. After the first firing, parts were removed, resistance were measured and repeated the firing. At the end of each firing, parts were removed and resistance values were measured. The test parts were mounted on terminal posts and electrically connected to a digital ohm-meter. The temperature was adjusted to 25° C. The total resistance values in milliohms were divided by the total number of conductor squares excluding the area of the via-fill conductors. The results were recorded as milliohms per square. The resistivity of the lines could be adjusted by printing the conductor lines thinner or thicker and/or changing the total solids in the formulation. Generally, the silver-based system was more prone to increase the resistance after each firing and/or break the connective lines. The results (FIGS. 3 and 4) show a very consistent property performance after repeated firing up to ten times without any electrical shorting or failure of any circuits.

Fired parts were cut, using a diamond cutter, polished, and microstructures were taken using Scanning Electron Microscope (SEM) to evaluate the overall microstructure; interconnection between via-fill conductors and line conductors; the interfacial structure between via-fill conductors and surrounding dielectric side-walls. Evaluation of the SEM micrographs showed there was no separation of the vias from the dielectric side-walls or from the line conductors. Microstructures had uniform grain size distribution and were well densified throughout. Such a microstructure should give good conductivity and consistency in the conductive properties, after each refiring. Electrical measurements shown in the figures support this conclusion.

The various Green Tapes™ used in this invention in the performance evaluation are described in U.S. Pat. No. 6,147,019 and patent file EL0518 US NA and PTOS description provided above and as described in U.S. provisional application 60/703,530, which are hereby incorporated by reference, and commercially available products 943 PX, 951-AT Green Tape™ by E.I. du Pont de Nemours and Company.

EXAMPLES

In the Examples that follow, the glass compositions detailed in Table 1 were used. Glasses A, B, C, and D represent glasses that are useful in the present invention.

TABLE 1

GLASS FRIT COMPOSITIONS
Glass Composition (in weight percent total glass frit composition)

|  | A | B | C |
|---|---|---|---|
| Silicon Dioxide | 30.0 | 55.0 | 33.1 |
| Aluminum Trioxide | 10.1 | 14.0 | 6.7 |
| Boron Oxide | 8.0 | 7.5 | 0.0 |
| Barium Oxide | 26.1 | 0.0 | 23.1 |
| Calcium Oxide | 6.0 | 21.5 | 4.5 |
| Magnesium oxide | 1.7 | 1.0 | 0.0 |
| Strontium Oxide | 0.0 | 0.0 | 13.5 |
| Zirconium Oxide | 0.0 | 0.0 | 3.5 |
| Zinc Oxide | 10.0 | 0.0 | 15.6 |
| Lead oxide | 0.0 | 0.0 | 0.0 |
| Alkali oxides | 0.0 | 0.5 | 0.0 |
| Titanium Oxide/Iron oxide | 8.1 | 0.5 | 0.0 |

Example 1

SILVER and PALLADIUM-SILVER SYSTEMS
EXAMPLE FOR P-TOS TAPE

| Composition 1 | | Composition 2 | |
|---|---|---|---|
| Silver Powder | 92.8% | Silver Powder | 75.0% |
| Glass powder | 1.2% | Palladium Powder | 3.6% |
| Organic Medium* | 4.5% | Copper bismuth ruthenate | 0.8% |
| Organic Wetting Agent | 1.0% | Glass Powder | 4.5% |

-continued

SILVER and PALLADIUM-SILVER SYSTEMS
EXAMPLE FOR P-TOS TAPE

| Composition 1 | | Composition 2 | |
|---|---|---|---|
| Other Organics | Balance | Inorganic Oxide | 3.6% |
| | | Inorganic Boride | 1.6% |
| | | Organic Medium* | 9.4% |
| | | Organic Wetting agent | 1.0% |
| | | Other Organics | Balance |

Example 2

SILVER SYSTEM FOR 943 LTCC TAPE
(E. I. du Pont de Nemours and Company)

| Silver powder | 91.8% |
|---|---|
| Glass Powder | 1.2% |
| Organo titanate | 1.0% |
| Organic medium* | 4.5% |
| Organic wetting agent | 1.0% |
| Other Organics | Balance |

Example 3

GOLD SYSTEM FOR 951 LTCC TAPE
(E. I. du Pont de Nemours and Company)

| Composition 1 | | Composition 2 | |
|---|---|---|---|
| Gold powder | 90.0% | Gold powder | 90.0% |
| Frit powder | 2.8% | Frit powder | 2.8% |
| Inorganic oxide | 1.8% | Inorganic oxide | 1.8% |
| Organic medium* | 4.0% | Organic medium** | 4.0% |
| Organic wetting agent | 1.0% | Organic wetting agent | 1.0% |
| Other Organics | Balance | Other Organics | Balance |

*Texanol based medium
**Terpineol based medium

What is claimed is:

1. A thick film composition for use in low temperature co-fired ceramic circuits comprising, based on weight percent total thick film composition:
   (a) 30-96 weight percent finely divided particles selected from noble metals, alloys of noble metals and mixtures thereof;
   (b) 0.2-10 weight percent of one or more refractory glass compositions with a specific viscosity (log n) in the range of 6-7.6 at the firing temperature of said circuit; and
   (c) 2-20 weight percent organic medium comprising ethyl cellulose with a specific ethoxyl content in the range of 45.0-51.5 and degree of substitution of ethoxyl groups per anhydroglucose unit in the range of 2.22-2.73,
   said composition optionally containing 0.1-5 weight percent of an additional inorganic binder selected from (i) metal oxides, (ii) precursors of metal oxides; (iii) non-oxide borides; (iv) non-oxide silicides; and (v) mixtures thereof.

2. The composition of claim 1, wherein said glass compositions are immiscible or partially miscible with remnant glasses present in the low temperature co-fired ceramic substrate glasses at the firing conditions.

3. The composition of claim 1 wherein said ethoxyl content of ethyl cellulose is in the range of 48.0-49.5%.

4. The composition of claim 1 wherein said degree of substitution of ethoxyl groups per anhydroglucose unit is in the range of 2.46-2.58 units.

5. The composition of claim 1 wherein said noble metals are selected from the group consisting of Au, Ag, Pd, and Pt.

6. The composition of claim 1 wherein said alloys of noble metals are alloys of metal selected from the group consisting of Au, Ag, Pd and Pt.

7. The composition of claim 1 wherein said metal oxides are selected from the group consisting of oxides of Zn, Mg, Co, Al, Zr, Mn, Ni, Cu, Ta, W, La and mixtures thereof.

8. The composition of claim 1 wherein said precursors of metal oxides are precursors selected from the group consisting of Zn, Mg, Co, Al, Zr, Mn, Ni, Cu, Ta, W, La and mixtures thereof.

9. The composition of claim 1 wherein said refractory glass composition comprises, based on weight percent total glass composition 25-60% $SiO_2$, 10-20% $Al_2O_3$, 10-15% $B_2O_3$, 5-25% CaO, and 1-5% balance other network modifying ions.

10. The composition of claim 1 wherein said noble metal is spherical-shaped Au and wherein the average particle size distribution of said Au is in the range of 1 to 6 microns.

11. A method of forming a multilayer circuit comprising:
a) forming a patterned array of vias in a plurality of layers of green tape;
b) filling the vias in the green tape layer(s) of step (a) with a via-fill thick film composition;
c) printing patterned thick film functional layers over a surface of any or all of the via-filled green tape layers of step (b);
d) printing patterned layers of a surface thick film over the outermost surface of the Green tape layers of step (c);
e) laminating the printed green tape layers of step (d) to form an assemblage comprising a plurality of unfired interconnected functional layers separated by unfired green tape; and
g) cofiring the assemblage of step (e); and wherein one or more of said via-fill thick film composition, patterned thick film functional layers and surface thick film utilize the composition of claim 1.

12. A method of forming a multilayer circuit comprising:
a) forming a patterned array of vias in a plurality of layers of green tape;
b) filling the vias in the green tape layer(s) of step (a) with a via-fill thick film composition;
c) printing patterned thick film functional layers over a surface of some or all of the via-filled Green tape layers of step (b);
d) laminating the printed green tape layers of step (c) to form an assemblage comprising a plurality of unfired interconnected functional layers separated by unfired green tape;
e) printing at least one patterned layer of surface thick film composition over the assemblage of step (d); and
g) cofiring the assemblage and patterned layer(s) of step (e); and
wherein one or more of said via-fill thick film composition, patterned thick film functional layers and surface thick film utilize the composition of claim 1.

13. The method of any one of claims 11 or 12 wherein said via-fill thick film composition and at least one of said thick film functional layer(s) utilize the composition of claim 1 and wherein said via-fill thick film composition and thick film functional layer(s) are printed simultaneously in one single step.

14. A method of using the composition of claim 1 to form microwave and other high frequency circuit components selected from the group comprising: antenna, filters, baluns, beam former, I/O's, couplers, via feedthroughs, EM coupled feedthroughs, wirebond connection, and transmission lines, said method comprising disposing the thick film composition onto a substrate or via and subsequently firing the composition.

* * * * *

UNITED STATES PATENT AND TRADEMARK OFFICE
CERTIFICATE OF CORRECTION

PATENT NO.         : 7,666,328 B2                                                Page 1 of 1
APPLICATION NO.    : 11/601136
DATED              : February 23, 2010
INVENTOR(S)        : Nair et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 730 days.

Signed and Sealed this

Seventh Day of December, 2010

David J. Kappos
*Director of the United States Patent and Trademark Office*